(12) United States Patent
Jen

(10) Patent No.: US 10,079,315 B2
(45) Date of Patent: Sep. 18, 2018

(54) PLANAR DUAL-GATE NON-VOLATILE MEMORY DEVICE

(71) Applicant: UNITED MICROELECTRONICS CORP., Hsin-Chu (TW)

(72) Inventor: Po-Han Jen, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 195 days.

(21) Appl. No.: 14/483,177

(22) Filed: Sep. 11, 2014

(65) Prior Publication Data

US 2016/0020334 A1 Jan. 21, 2016

(30) Foreign Application Priority Data

Jul. 18, 2014 (CN) .................... 2014 1 0344900

(51) Int. Cl.
*H01L 29/792* (2006.01)
*H01L 29/66* (2006.01)
*H01L 29/423* (2006.01)

(52) U.S. Cl.
CPC ........ *H01L 29/792* (2013.01); *H01L 29/4234* (2013.01); *H01L 29/66833* (2013.01)

(58) Field of Classification Search
CPC ............... H01L 29/788; H01L 29/792; H01L 29/66484; H01L 29/7831; H01L 29/4234; H01L 29/66833
See application file for complete search history.

(56) References Cited

U.S. PATENT DOCUMENTS

| | | | |
|---|---|---|---|
| 7,078,761 B2 | 7/2006 | Wang | |
| 2002/0149060 A1* | 10/2002 | Ogura | G11C 16/0466 257/365 |
| 2007/0272974 A1* | 11/2007 | King | H01L 27/115 257/324 |
| 2008/0303094 A1* | 12/2008 | Rao | H01L 21/28273 257/365 |

* cited by examiner

*Primary Examiner* — Matthew Landau
*Assistant Examiner* — Mark Hatzilambrou
(74) *Attorney, Agent, or Firm* — Winston Hsu

(57) ABSTRACT

The present invention provides a semiconductor structure, including a substrate, a gate dielectric layer disposed on the substrate, a charge storage layer disposed on the gate dielectric layer, and at least two poly silicon layers, disposed on the gate dielectric layer respectively, and covering parts of the charge storage layer simultaneously.

10 Claims, 5 Drawing Sheets

PLANAR DUAL-GATE NON-VOLATILE MEMORY DEVICE

BACKGROUND OF THE INVENTION

1. Field of the Invention

The present invention relates to a semiconductor structure and the manufacturing method thereof, in particular, to a semiconductor structure applied in SONOS memory.

2. Description of the Prior Art

During the programming of a typical silicon-oxide-nitride-oxide-silicon (SONOS) memory, electrical charge is transferred from a substrate to the charge storage layer in the device, such as the nitride layer in the SONOS memory. Voltages are applied to the gate and drain creating vertical and lateral electric fields, which accelerate the electrons along the length of the channel. As the electrons move along the channel, some of them gain sufficient energy to become trapped in the charge storage dielectric material. This jump is known as hot carrier injection, in which the hot carriers are the electrons. Charges are trapped near the drain region as the electric fields are strongest near the drain. Reversing the potentials applied to the source and drain will cause electrons to travel along the channel in the opposite direction and be injected into the charge storage dielectric layer near the source region. Since parts of the charge storage dielectric layer are electrically conductive, the charged introduced into these parts of the charge storage dielectric material tend to remain localized. Accordingly, depending upon the application of voltage potentials, electrical charge can be stored in discrete regions within a single continuous charge storage dielectric layer.

However, the ability for trapping and retaining electrical charges under current SONOS architecture is still not perfect, including shortcomings such as insufficient trapping sites for charges as well as easy leakage. Hence how to effectively improve the current SONOS architecture to increase the overall performance of the device has become an important task in this field.

SUMMARY OF THE INVENTION

The present invention provides a semiconductor structure, comprising a substrate, a gate dielectric layer disposed on the substrate, a charge trapping layer disposed on the gate dielectric layer, and at least two poly silicon layers, disposed on the gate dielectric layer respectively, and covering parts of the charge trapping layer simultaneously.

The present invention further provides a manufacturing method for forming a semiconductor structure, at least comprising the following steps: first, a substrate is provided, a gate dielectric layer is then formed on the substrate, next, a charge trapping layer is formed on the gate dielectric layer, and at least two poly silicon layers are formed on the gate dielectric layer respectively, and covering parts of the charge trapping layer simultaneously.

The feature of the present invention is providing a novel semiconductor structure which can be applied in SONOS memory and the manufacturing process thereof. The gate dielectric layer, the poly silicon layer and the charge trapping layer of the present invention have particular relative positions, especially the charge trapping layer being a flat structure, only covering partial region of the gate dielectric layer, and the present invention has some advantages like a simple manufacturing process and a high yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
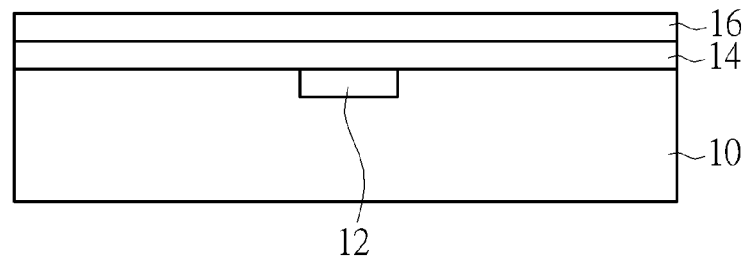
FIGS. 1-8 illustrate a method for forming a semiconductor structure according to a preferred embodiment of the present invention.
Figure 2:
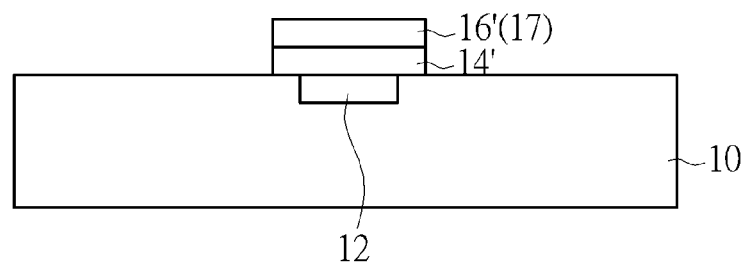

Please refer to FIGS. 1-8, FIGS. 1-8 illustrate a method for forming a semiconductor structure according to a preferred embodiment of the present invention. As shown in FIG. 1, a substrate 10 is provided, the substrate 10 being, for example, a bulk silicon substrate, a silicon containing substrate, a III-V semiconductor-on-silicon (such as GaAs-on-silicon) substrate, a graphene-on-silicon substrate, or a silicon-on-insulator (SOI) substrate. A tunnel implanted region 12 is formed within the substrate 10, the tunnel implanted region 12 can be formed through an ion implantation process, and the process will not be detail described here. Afterwards, a plurality of material layers is formed on the substrate 10, such as a dielectric layer 14 and a dielectric layer 16, the dielectric layer 14 such as a silicon oxide layer, and the dielectric layer 16 such as a silicon nitride layer. As shown in FIG. 2, a patterning process is performed, such as performing an exposing process, a development process and an etching process sequentially, to remove parts of the dielectric layer 14 and the dielectric layer 16. After the patterning process, a dielectric layer 14' and a dielectric layer 16' remain, wherein the dielectric layer 16' can be deemed as a charge trapping layer 17, disposed right above the tunnel implanted region 12.

Figure 3:
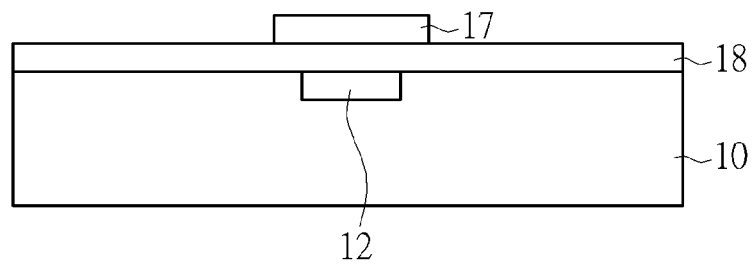

As shown in FIG. 3, another dielectric layer is formed on the surface of the substrate 10, the dielectric layer such as a silicon oxide layer, can be formed through an oxygenation process or a deposition process. Therefore, the dielectric layer may not only be disposed on the substrate 10, but also be disposed on charge trapping layer 17. The dielectric layer and patterned dielectric layer 14 form a gate dielectric layer 18 together. In this embodiment, the thicknesses of the dielectric layer shown in FIG. 3 and the dielectric layer 14 shown in FIG. 2 are same or different. Generally, the thickness of the dielectric layer 14 shown in FIG. 2 is about 70-80 Å(angstroms), and the thickness of the dielectric layer shown in FIG. 3 is about 25-80 Å, and material of both dielectric layer are preferably the same, and they are both silicon oxide in this embodiment. Moreover, in this embodiment, the width of charge trapping layer 17 is about 0.3-0.6 µm. Of course, the thickness and width mentioned above can be adjusted according to actual requirements, and the present invention is not limited thereto.

Figure 4:
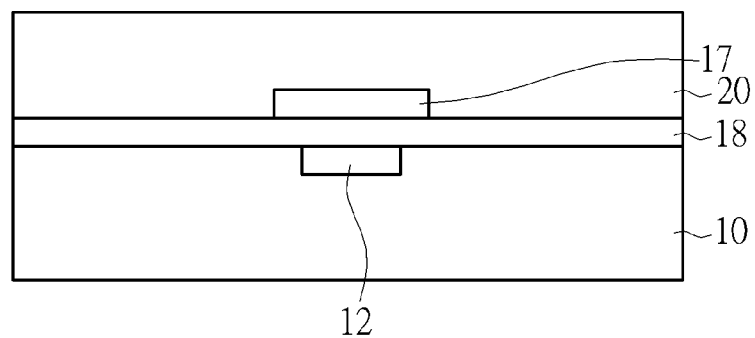
Figure 5:
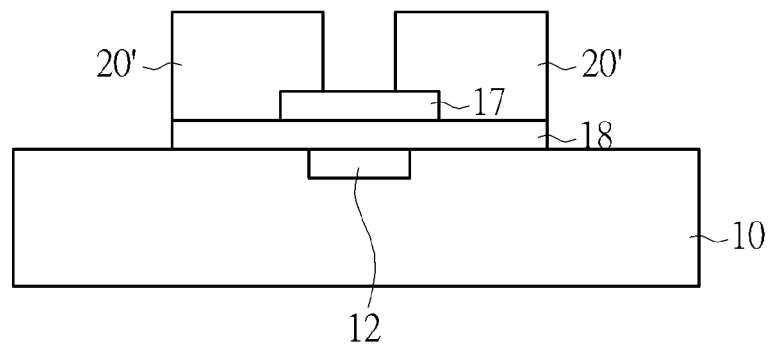

As shown in FIGS. 4-5, a poly silicon layer 20 is formed to cover the gate dielectric layer 18 and the charge trapping layer 17. Afterwards, as shown in FIG. 5, a patterning process is performed, to remove parts of the poly silicon layer 20 and parts of the gate dielectric layer 18. It is worth noting that in this embodiment, at least two patterned poly silicon layers 20' are formed, and these two patterned poly silicon layers 20' respectively cover parts of the charge trapping layer 17, especially covering the two ends region of the charge trapping layer 17, so the central region of the charge trapping layer 17 is not covered by the patterned poly silicon layer 20' and is exposed. In addition, the charge trapping layer 17 is disposed on the gate dielectric layer 18, but the width of the charge trapping layer 17 is smaller than the width of the gate dielectric layer 18, therefore the charge trapping layer 17 can only cover partial region of the gate dielectric layer 18, and the other region of the gate dielectric layer 18 which is not covered by the charge trapping layer 17 contacts the poly silicon layer 20' directly.

Figure 6:
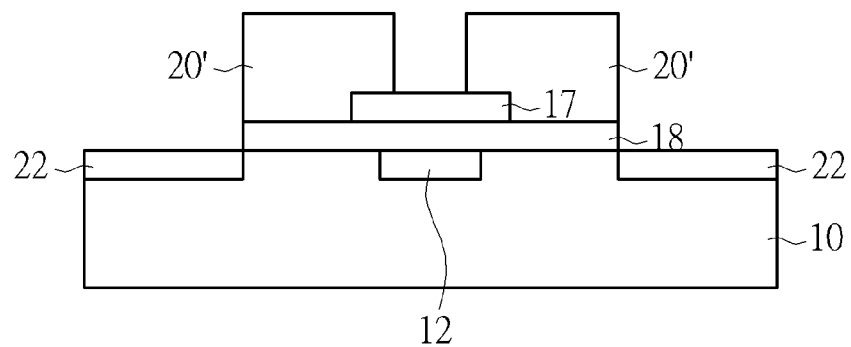

As shown in FIG. 6, an ion plantation process is performed, to form a lightly doped drain (LDD) 22 in two sides of the gate dielectric layer 18 of the substrate 10. Those processes mentioned above are a well-known technology and will not be redundantly described here. Besides, in this embodiment, the tunnel implanted region 12 is formed before the dielectric layer 14 is formed (please refer to FIG. 1), but the present invention is not limited thereto. In another embodiment of the present invention, the tunnel implanted region 12 can be formed after the poly silicon layer 20 is patterned, and the tunnel implanted region 12 and the LDD 22 can be formed at the same time or at different times. For example, after the poly silicon layer 20 is patterned, the tunnel implanted region 12 is firstly formed in the substrate 10, and the lightly doped drain region 22 is then formed. The steps flow mentioned above is also comprised in the scope of the present invention.

Figure 7:
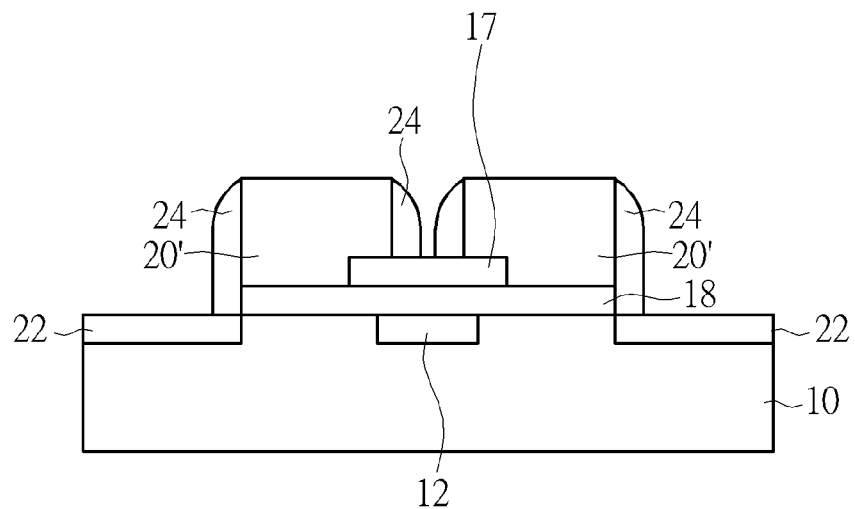

As shown in FIG. 7, a spacer 24 is formed in each sidewall of the poly silicon layer 20', the spacer 24 at least covers the outer-side of whole semiconductor structure. In other words, the spacer 24 at least covers the sidewall of the poly silicon layer 20', which is disposed right above the lightly doped drain region 22. The sidewall of the poly silicon layer 20', which is disposed right above the tunnel implanted region 12, or in other words, the region between two poly silicon layers 20', is covered by the spacer 24 selectively. Generally, the process for forming the spacer 24 includes entirely forming a dielectric layer (not shown) on the substrate 10, the poly silicon layer 20' and the charge trapping layer 17, and an anisotropic etching process is then performed, to remove parts of the dielectric layer, and the spacer 24 remains. In addition, the dielectric layer can be a single layer structure or a multiple layer structure. Therefore, the spacer 24 comprises single layer structure or multiple layer structure too. The manufacturing process for forming the spacer is a well-known technology, and will not be redundantly described here.

Figure 8:
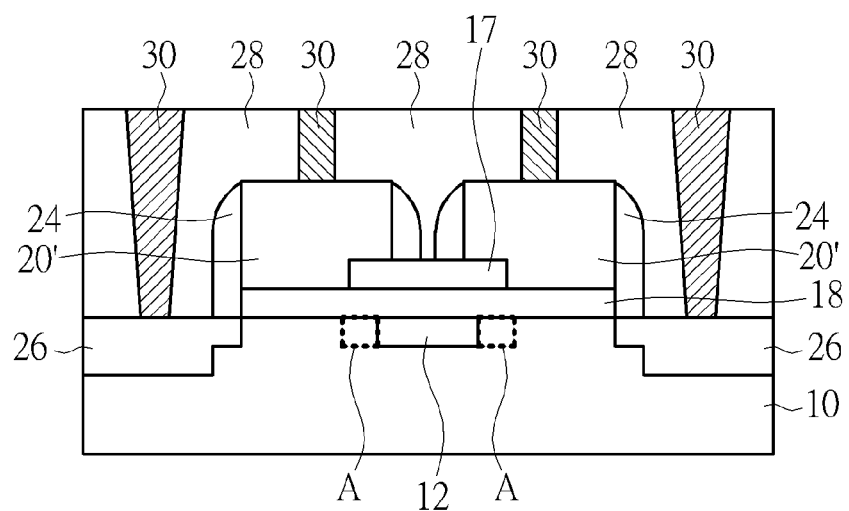

Finally, as shown in FIG. 8, another ion plantation process is performed, to form a source/drain region 26 in the substrate 10, the source/drain region 26 is partially over-lapped with the LDD 22. Afterwards, a dielectric layer 28 is formed, such as a silicon oxide layer or a silicon nitride layer. Next, a plurality of contact structures 30 is formed on each source/drain region 26 and each top surface of the poly silicon layer 20', the contact structure 30 includes materials with good conductivity, such as metals or alloys. After this step, the semiconductor structure of the present invention is completed.

The semiconductor structure of the present invention, please refer to FIG. 8, includes the substrate 10, the gate dielectric layer 18 disposed on the substrate 10, the charge trapping layer 17 disposed on the gate dielectric layer 18, and at least two poly silicon layers 20', disposed on the gate dielectric layer 18 respectively, and covering parts of the charge trapping layer 17 simultaneously. Besides, the tunnel implanted region 12 is disposed in the substrate 10, and the tunnel implanted region 12 is disposed under the charge trapping layer 17. It is worth noting that in the present invention, the width of the charge trapping layer 17 is preferably larger than the width of the tunnel implanted region 12, therefore, parts of the un-implanted region exist in the substrate 10 between two sides of the tunnel implanted region 12 and the charge trapping layer 17, such as the region A in FIG. 8. Therefore, it can ensure that when the semiconductor structure of the present invention is applied as a SONOS memory, before the tunnel is formed, the region in the substrate 10 and disposed on two sides of the tunnel implanted region 12 (such as the region A) is isolated, so that the trapped charges which are stored in the charge trapping layer 17 are not easy to lose. In addition, the charge trapping layer 17 of the present invention is not limited to a single layer structure or multiple layer structure. Besides the silicon nitride, the charge trapping layer 17 may also comprise a silicon oxide layer on a silicon nitride layer stacked structure, or a multiple layer structure consisting of other dielectric layers. Furthermore, the semiconductor structure of the present invention comprises: a plurality of spacers 24, covering on the sidewall of each poly silicon layer 20'; at least one source/drain region 26 and the LDD 22, disposed in the substrate 10 and on the two sides of the poly silicon layer 20'; and a plurality of contact structure 30, disposed on each source/drain region 26 and on each poly silicon layer 20', contacting the source/drain region 26 and the poly silicon layer 20'.

The feature of the present invention is the relative position of the gate dielectric layer 18, the charge trapping layer 17 and the poly silicon layer 20'. Please refer to FIGS. 5 and 8, when viewing in the source to drain cross section diagram, two poly silicon layers 20' cover parts of the charge trapping layer 17 respectively, especially covering the two ends region of the charge trapping layer 17, and the central region of the charge trapping layer 17 is not covered by the poly silicon layer 20' and is exposed. Besides, the charge trapping layer 17 is a flat structure, disposed on the gate dielectric layer 18, but the width of the charge trapping layer 17 is smaller than the width of the gate dielectric layer 18, so the charge trapping layer 17 only covers a partial region of the gate dielectric layer 18, and the other region of the gate dielectric layer 18 which is not covered by the charge trapping layer 17 contacts the poly silicon layer 20' directly. In addition, the width of the tunnel implanted region 12 is smaller than the charge trapping layer 17, and the charge trapping layer 17 is disposed on the position right above the tunnel implanted region 12.

Figure 9:
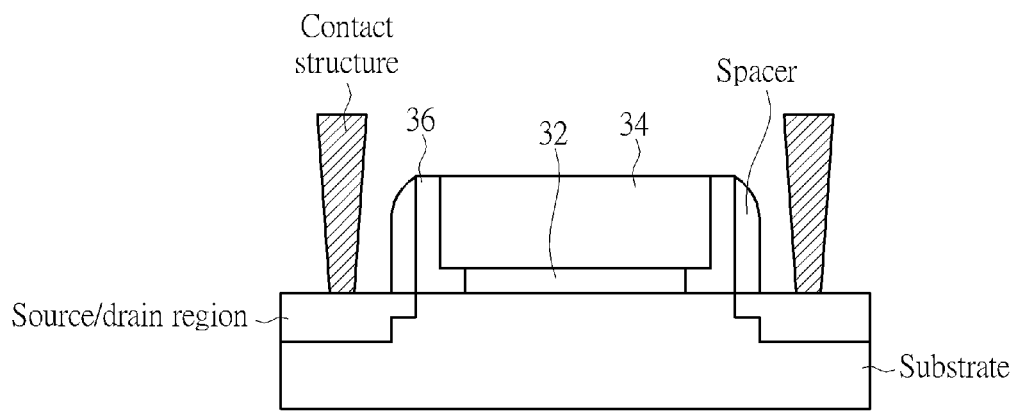
FIG. 9 illustrates a schematic diagram of a conventional SONOS structure.

The semiconductor structure of the present invention can be applied as a SONOS memory, the principle of operation is same as conventional SONOS memories, but it is easier to be produced and has better the yield. FIG. 9 illustrates a schematic diagram of a conventional SONOS structure. As shown in FIG. 9, in the manufacturing process of the SONOS structure, after the gate dielectric layer 32 and the gate structure 34 are formed on the substrate, an etching process (such as an wet-etching process) is then performed to remove the edge portion of the gate dielectric layer 32 under the gate structure 34. Next, an L-shaped charge trapping layer 36 is then formed on the sidewall of the gate structure 34 and in the space under the gate structure 34. However, in general situation, the thickness of the gate dielectric layer 32 is not thick (usually lower than 100 angstroms), so the charge trapping layer 36 is not easy to fill in the space (the removed edge portion of the gate dielectric layer 32) under the gate structure 34, causing the defects in manufacturing processes. On the other hand, in the present invention, since the charge trapping layer 17 is formed before the poly silicon layer 20' is formed, therefore the defects mentioned above will not happen in the present invention.

In summary, the feature of the present invention is providing a novel semiconductor structure which can be applied in SONOS memory and the manufacturing process thereof. The gate dielectric layer, the poly silicon layer and the charge trapping layer of the present invention have particular relative positions, especially the charge trapping layer being a flat structure, only covering partial region of the gate dielectric layer, and the present invention has some advantages like a simple manufacturing process and a high yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate;
    a gate dielectric layer disposed on the substrate;
    a charge trapping layer disposed on the gate dielectric layer, wherein the charge trapping layer includes a bottom surface and a top surface parallel to the bottom surface, the bottom surface totally contacts the gate dielectric layer directly, and the top surface does not contact the gate dielectric layer directly; and
    at least two poly silicon layers, disposed on and directly contact the gate dielectric layer respectively, each of the at least two poly silicon layers covering and directly contacting parts of the top surface of the charge trapping layer simultaneously.

2. The semiconductor structure of claim 1, further comprising a tunnel implanted region disposed in the substrate, and disposed under the charge trapping layer.

3. The semiconductor structure of claim 2, wherein a width of the tunnel implanted region is smaller than a width of the charge trapping layer.

4. The semiconductor structure of claim 1, wherein the charge trapping layer comprises a single layer structure or a multiple layer structure.

5. The semiconductor structure of claim 1, further comprising a plurality of spacers, disposed beside each poly silicon layer.

6. The semiconductor structure of claim 1, further comprising at least one source/drain region, disposed within the substrate beside the poly silicon layers.

7. The semiconductor structure of claim 6, further comprising a plurality of contact structures, contacting the poly silicon layers and the source/drain region.

8. The semiconductor structure of claim 1, wherein the charge trapping layer is a flat structure.

9. The semiconductor structure of claim 1, wherein a width of the charge trapping layer is smaller than a width of the gate dielectric layer.

10. The semiconductor structure of claim 1, wherein parts of the charge trapping layer are not exposed by the poly silicon layers.

* * * * *